United States Patent [19]

Rozman et al.

[11] Patent Number: 4,972,141
[45] Date of Patent: Nov. 20, 1990

[54] WATTHOUR METER OR WATTMETER COMPRISING HALL SENSORS

[75] Inventors: Miro Rozman, Lesce; Silvo Zlebir, Cerklje, both of Yugoslavia

[73] Assignee: Iskra-Sozd Elektrokovinske Industrije N, Sol.O, Ljubljana, Yugoslavia

[21] Appl. No.: 289,315

[22] Filed: Dec. 23, 1988

[51] Int. Cl.$^5$ ............................................. G01R 21/08
[52] U.S. Cl. .................................. 324/142; 324/117 H
[58] Field of Search ............... 324/142, 117 R, 117 H, 324/252, 132; 328/160; 364/483

[56] References Cited

U.S. PATENT DOCUMENTS

| | | | |
|---|---|---|---|
| 4,764,720 | 8/1988 | Nystrom | 324/142 |
| 4,808,918 | 2/1989 | Rozman | 324/142 |

OTHER PUBLICATIONS

Analoge Integrierte Schaltungen, p. 288, M. Herpy, 1976.

Operational Amplifiers, pp. 155–156, G. B. Clayton, 1971.

Primary Examiner—Reinhard J. Eisenopf
Assistant Examiner—Edward Urban
Attorney, Agent, or Firm—Fleit, Jacobson, Cohn, Price, Holman & Stern

[57] ABSTRACT

A watthour meter or a wattmeter comprising Hall sensors and possessing a precise linearity of the conversion of low voltage into frequency within a broad dynamic range. The required linearity is achieved by providing a multiplication-adding circuit MS with a current output, to which the noninverting input of the last operational amplifier in the circuit is connected, by providing a current-frequency converter IFC with a differential integrator DI comprising an active compensation feedback circuit, by shunting the output and the input of the converter IFC by a compensation circuit CC to compensate the ripple, offset and charge injections of electronic switches, and by placing the Hall sensors so that the magnetic induction direction in the slits of a ferromagnetic yoke is different for each sensor of a pair of them.

23 Claims, 8 Drawing Sheets

WATTHOUR METER OR WATTMETER COMPRISING HALL SENSORS

BACKGROUND OF THE INVENTION

1. Technical Field

This invention relates to a watthour meter or a wattmeter with a precise linearity of the conversion of low voltages into frequency within a broad dynamic range.

In the proposed meters a voltage-to-current converter converts the load voltage drop into electric currents, which are conducted to a multiplication-adding circuit.

The foregoing circuit is composed of $2n$ multiplication circuits connected in cascade and controlled by two non-overlapping switching signals. Each of said circuits is provided with a Hall sensor. These Hall sensors are either placed in two slits of a single ferromagnetic yoke surrounding a conductor or in a slit of either of two ferromagnetic yokes, each yoke surrounding a different conductor, in which conductors the load current is conducted. The meter further comprises a current-frequency converter, in which there are connected in series an integrator, to whose second input a reference current generator with a controlled reversal of the polarity of its outputs is connected, a comparator, and a logic control circuit, while the output of the multiplication-adding circuit is connected to the first input of the afore-mentioned integrator. A digital signal generator generates a clock signal and basic switching signals.

2. Description of the Prior Art

There has been known a watthour meter or a wattmeter described in patent applications DE No. 37,02,344 A1 and YU No. 564/86, in which meter Hall voltage is converted into frequency. The offset voltage influence is reduced by reversing the integrating capacitor.

In the multiplication-adding circuit according to the patent application YU No. 564/86 three multiplication circuits provided with a Hall sensor are cascade connected to each other. The current terminals of the Hall sensor in the second multiplication circuit are connected to the common terminals of the first and of the fourth switch and to the common terminals of the second and of the third switch. The input current is supplied to the common terminals of the first and of the third switch, while the common terminal of the two other switches is connected to the output of the operational amplifier, to whose inverting input the first voltage terminal of the Hall sensor is connected. The second voltage terminal of the sensor is connected to the noninverting input of the operational amplifier of the third multiplication circuit. The noninverting input of the operational amplifier of the first multiplication circuit is grounded, the second voltage terminal of the Hall sensor of the third multiplication circuit, however, represents the output of the multiplication-adding circuit. The first and the second switch, and the third and the fourth switch, respectively, are controlled by the same non-overlapping switching signals.

The output voltage signal of the described multiplication-adding circuit is susceptible to external interferences. In both known meters the action of charge injections taking place in electronic switches is neglected. Further, monolithic technology is not quite appropriate for a meter with reversing integrating capacitor because of considerable parasitic capacitance of said capacitor. In addition, for said meters the problem of the temperature compensation, of the aging, and of the voltage dependence of the Hall sensor is not resolved.

SUMMARY OF THE INVENTION

In accordance with the foregoing background discussion the object of this invention is to provide a meter of said kind for a precisely linear conversion of low voltages into frequency in a broad dynamic range by compensating within the integrator the offset voltage of operational amplifiers and the electric current resulting from charge injections when reversing electronic switches and from a charge leakage within said switches, and the time and temperature instability of integrator elements. Further, the influence of the fluctuation of the voltage energizing the integrated circuit and the influence of the potential difference between the current terminals of the Hall sensor as well as the influence of the temperature-dependent offset voltage of said sensor must be compensated. The influence of the Hall sensor asymmetry has to be compensated, too. Finally, the Hall sensor has to be shielded from any interfering external magnetic field.

With the foregoing objects in view, the watthour meter in accordance with the invention is characterized by features of the characterizing portion of the first claim. Further embodiments of the invention arise out of dependent claims.

Specific embodiments of the invention will be presented in the following detailed description in conjunction with the accompanying drawings.

DETAILED DESCRIPTION OF THE PREFERRED EMBODIMENTS

The meter in accordance with the invention includes a voltage-to-current converter UIC, a multiplication-adding circuit MS, a current-frequency converter IFC, a compensation circuit CC, a digital signal generator SG (FIG. 1), and a ferromagnetic yoke 44; 44', 44", which surrounds a conductor conducting a load current $I_L$; $I_{LR}$, $I_{LS}$ and in whose slits Hall sensors 1, 2, ... 2n (FIGS. 9a, b; 10) are placed.

To the meter input there is connected the input of a comparator $C_1$ comprised in the digital signal generator SG. The output of the comparator $C_1$ is connected to an input of a frequency divider FD, to whose another input there is connected a crystal oscillator Q. At the output of the frequency divider FD, basic switching signals $A_1$, $P_1$, which are—depending on the embodiment—applicable just at switching on the meter, and a clock signal Cl are tapped off. The signals $A_1$, $P_1$ are either synchronized with the oscillation of the mains voltage $U_L$ or are generated by the crystal oscillator Q.

Figures 1, 1A:
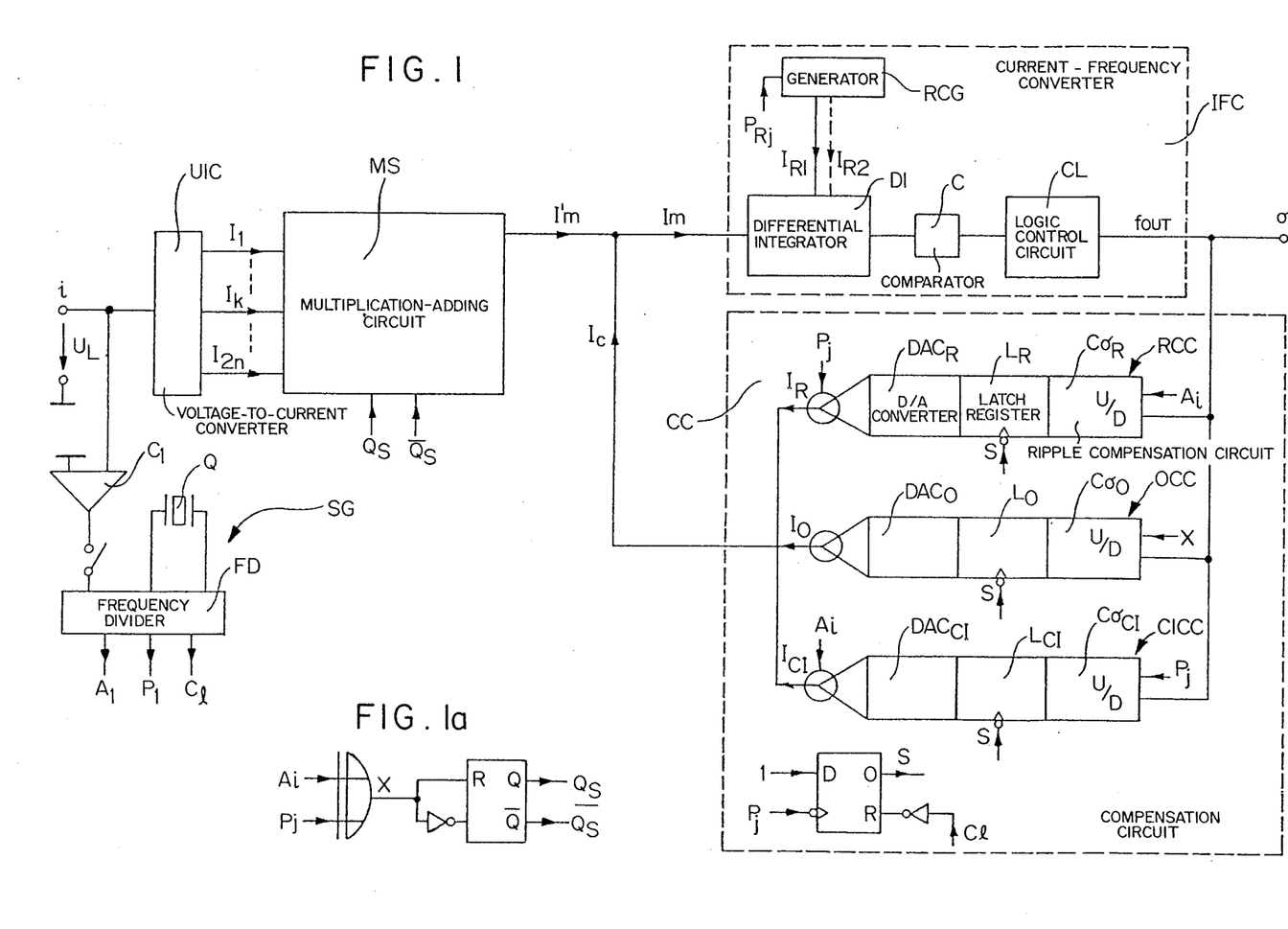
FIGS. 1 and 1a is a block diagram of the meter embodiment of the invention.
Figure 6:
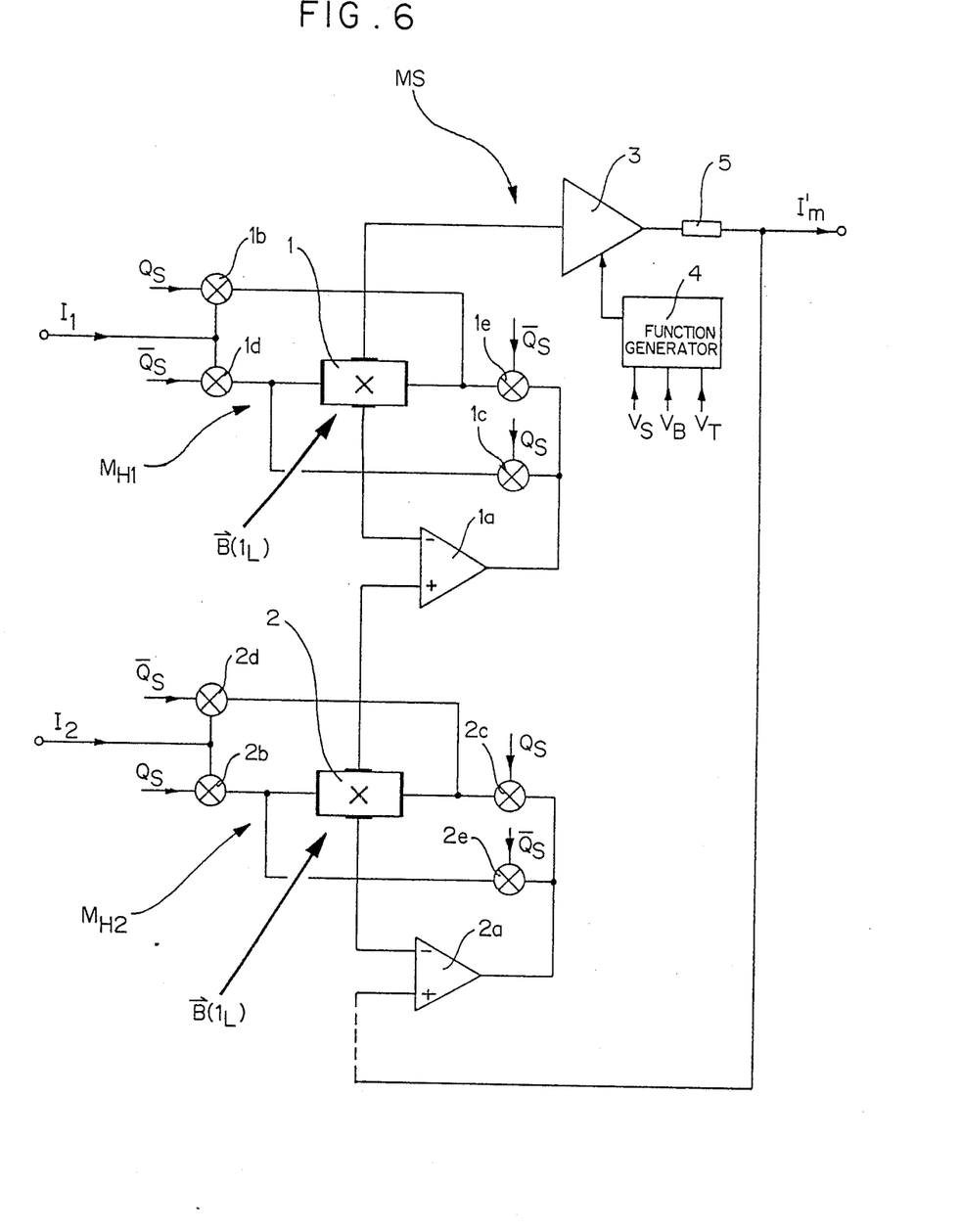
FIG. 6 is a circuit diagram of a multiplication-adding circuit.

To the meter input i also the input of the voltage-to-current converter UIC is connected, in which converter the load voltage drop $U_L$ is converted to currents $I_1$, ... $I_{2n}$ appearing at 2n outputs of said converter (FIG. 1). Each one of the aforementioned 2n outputs is connected to the input of a corresponding multiplication circuit $M_{Hk}$ (k=1, ... 2n) provided with a Hall sensor k. The circuits $M_{Hk}$ are in a known way interconnected in a cascade by operational amplifiers 1a, 2a, ... 2na (cf. FIG. 6); and in a known way controlled by non-overlapping switching signals $Q_S$, $\bar{Q}_S$ (FIG. 6). The signals $Q_S$, $\bar{Q}_S$ are tapped from the outputs Q, $\bar{Q}$ of a RS-flipflop (FIG. 1), to whose input signals X, $\bar{X}$ are conducted; the signal X is tapped from the output of an exclusive OR gate, to whose inputs signals $A_i$, $P_j$ are conducted, the indices i, j depending on the meter embodiment. The sequence of the signals $Q_S$, $\bar{Q}_S$ on two multiplication circuits $M_{Hk}$ depends on how the respective Hall sensors are oriented with respect to the direction of the magnetic induction $\bar{B}$. According to the invention, the first voltage terminal of the Hall sensor 1 is connected to the input of a variable gain amplifier 3. The output voltage of the amplifier 3 is converted by a resistor 5 into a partially compensated measuring current $I_m'$ at the output of the multiplication-adding circuit MS. The output of the circuit MS is connected to the noninverting input of the operational amplifier 2na in the circuit $M_{H2n}$ (cf. FIG. 6; claim 1, 11. 25, 26). The direction of the measuring current $I_m'$ changes in synchronism with the signals $Q_S$, $\bar{Q}_S$. The output of the multiplication-adding circuit MS of the invention is connected to the noninverting output of an amplifier 2na in the last multiplication circuit $M_{H2n}$.

The gain of the amplifier 3 is controlled by the output signals of a function generator 4. This output signal depends on the energizing voltage $V_B$ for the integrated circuit, on the voltage $V_S$ between the current terminals of the Hall sensor k, and on the temperature-dependent offset voltage $V_T$. In this way, according to the invention, some interference effects on the measuring current are compensated, the effects originating from the aging and the temperature dependence of the semiconductor Hall sensor, and the effect originating from the fluctuation of the energizing voltage $V_B$. A compensated measuring current $I_m$ already including a compensation current $I_c$, which is to be described later, is conducted to the first input of a differential integrator DI; DI'.

The current-frequency converter IFC comprises, connected in series, the differential integrator DI; DI', to whose second and/or third input a reference current generator RCG; RCG' is connected, a comparator C; C' and a logic circuit CL; CL' (FIG. 1).

Figure 2:
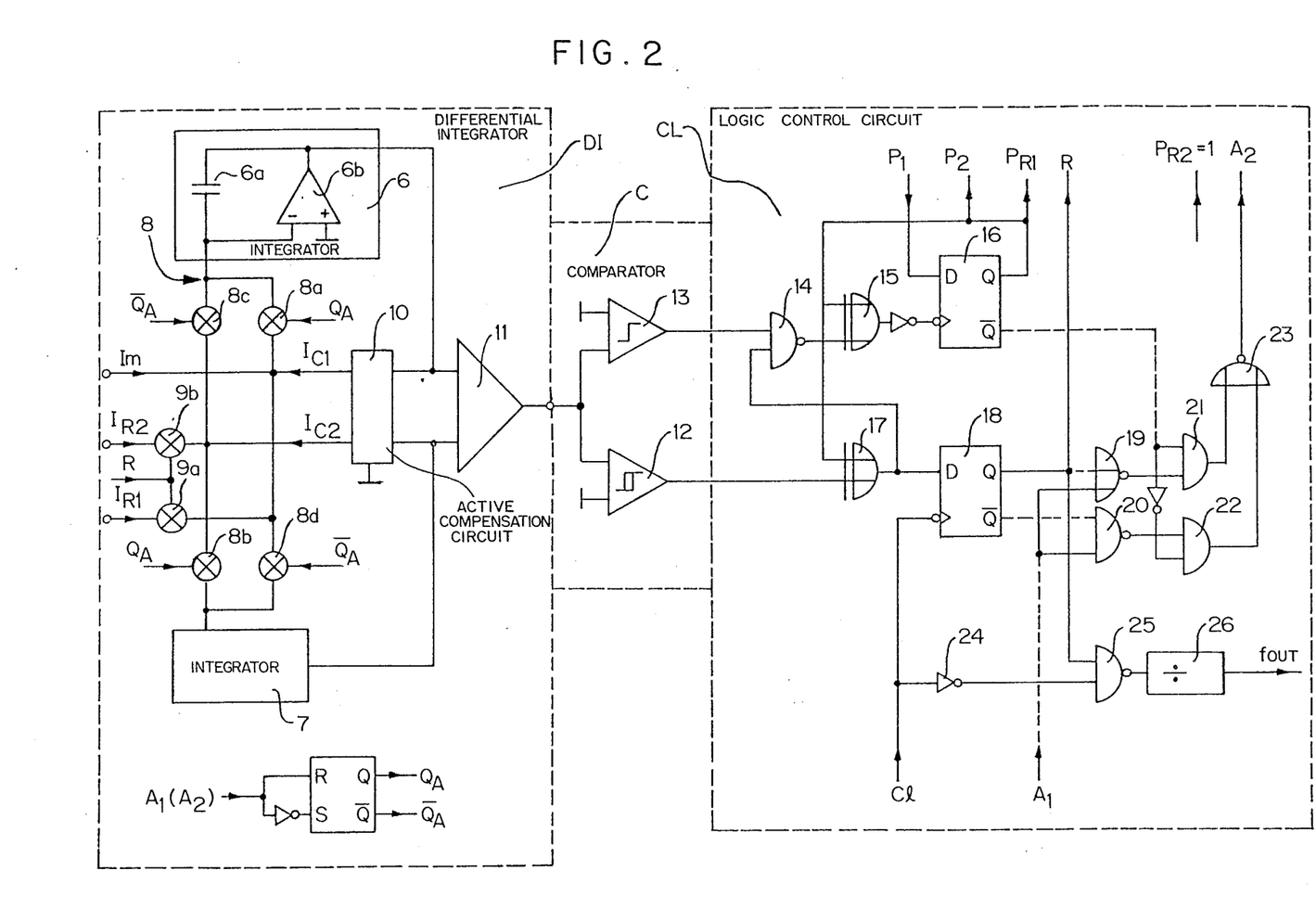
FIG. 2 is a circuit diagram of the basic embodiment of a differential integrator, of a comparator, and of a logic control circuit.
Figure 3:
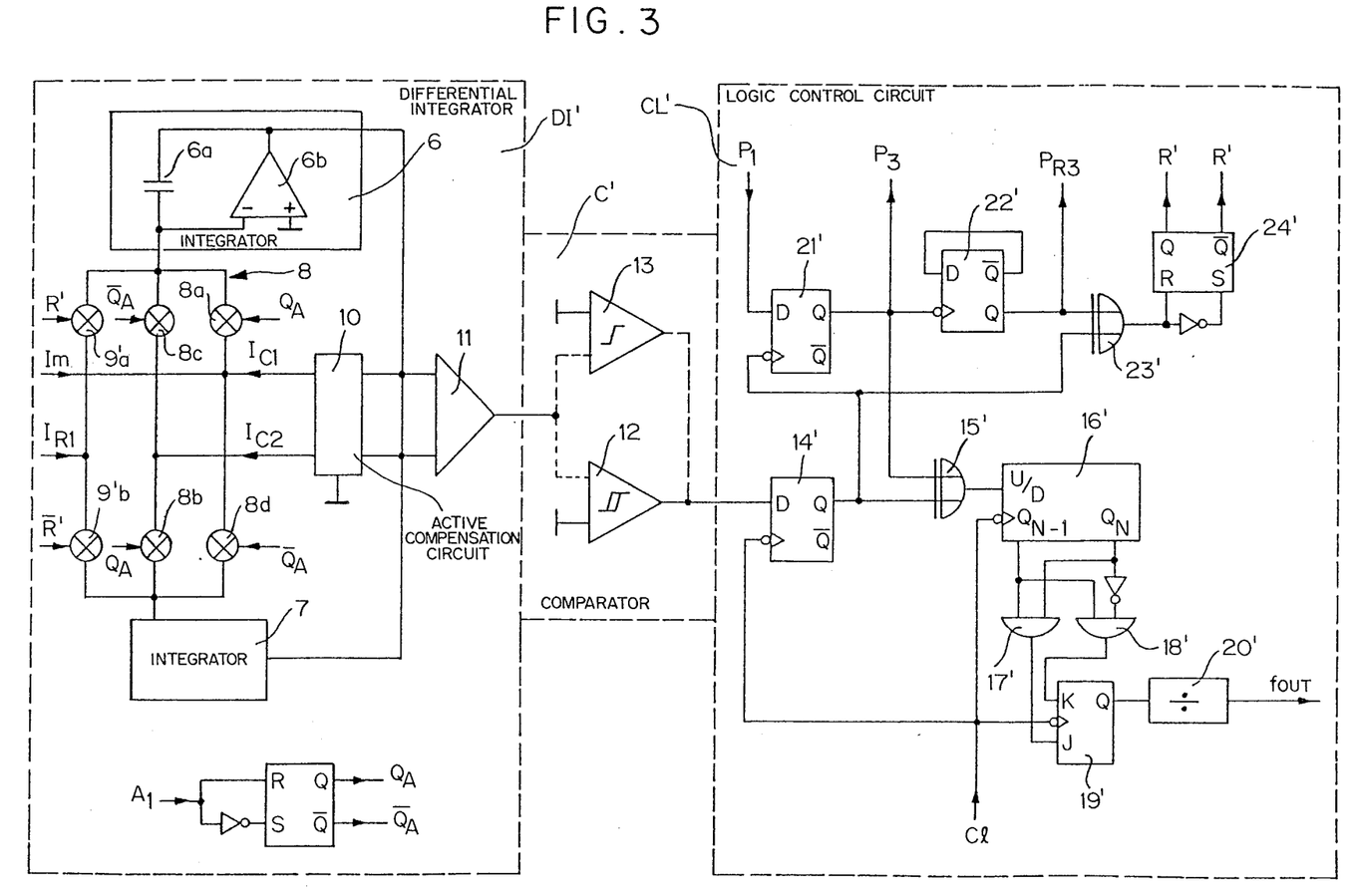
FIG. 3 is a circuit diagram of another embodiment of a differential integrator, of a comparator, and of a logic control circuit.

The inputs of the integrators 6, 7 comprised in the differential integrator DI, DI' are connected to a common terminal of controlled switches 8a, 8c and 8b, 8d, respectively (FIGS. 2, 3). The outputs of the integrators 6, 7 are connected to the first and to the second input of the differential amplifier 11, respectively, whose output is also the output of the differential integrator DI, DI', and to the first and to the second input of an active compensation circuit 10; 10', respectively. The third input, however, is grounded. The first input of said circuit 10 is connected to a common terminal of the switches 8a, 8b, which terminal is connected to the first input of the differential integrator DI, DI', the second input of said circuit 10 is connected to the common terminal of the switches 8b, 8c. The generator RCG, RCG' is connected to the differential integrator DI, DI' through controlled switches 9a, 9b, which are connected to a switching bridge 8 performed by the switches 8a, b, c, d as it will be described below.

Figure 4:
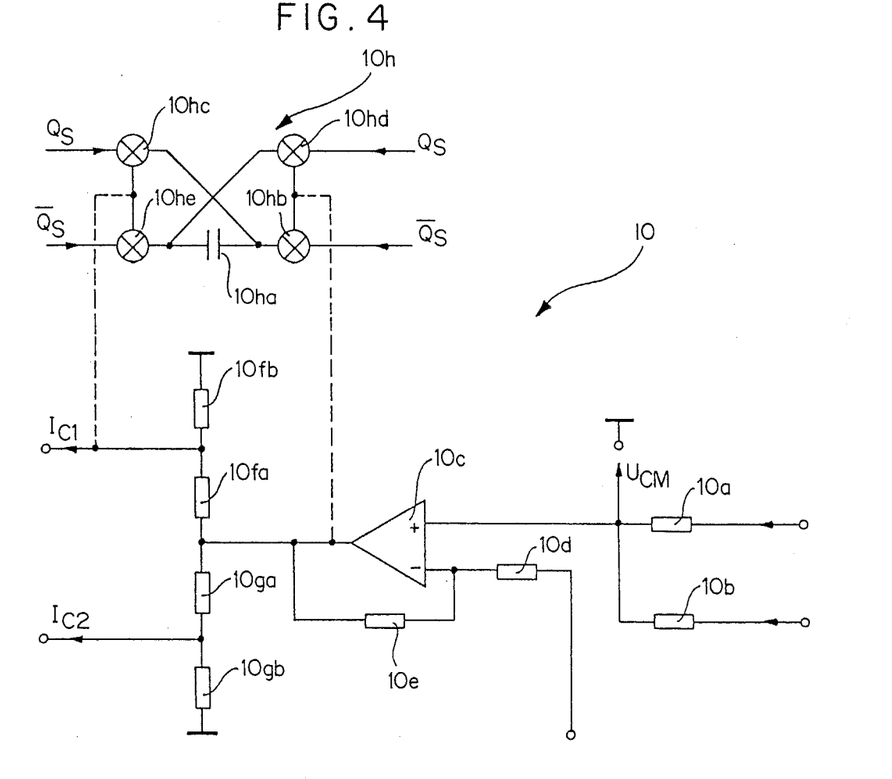
FIG. 4 is a circuit diagram of the basic embodiment of a compensation feedback circuit.

The basic embodiment of the active compensation feedback circuit 10 is shown in FIG. 4. To the first input of said circuit 10 a resistor 10a is connected and to the second input a resistor 10b is connected. The second terminal of the resistor 10a is connected to the second terminal of the resistor 10a and to the noninverting output of an operational amplifier 10c. The inverting input of the amplifier 10c is connected through a resistor 10d to the third input of the circuit 10 and through a resistor 10e to the output of the amplifier 10c. The output of the amplifier 10c is grounded through two pairs of resistors 10fa, 10fb and 10ga, 10gb. Common terminals of the resistors in the aforementioned pairs are the first and the second output of said circuit 10, respectively. The resistances of the resistors in the first and the second pair are oppositely equal to achieve a high output impedance of said circuit 10. Therefore the resistors 10fb and 10gb are provided with an impedance converter.

By the before described circuit 10 the common modes of the differential integrator DI, DI' are damped and even at an asymmetric excitation a symmetric behaviour of the output voltage of the integrators 6, 7 is achieved. At voltage asymmetry on the inputs of this circuit 10, a common mode voltage $U_{CM}$ appears on the noninverting input of the amplifier 10c; this voltage $U_{CM}$ is amplified by the amplifier 10c. Compensation currents $I_{c1}$, $I_{c2}$ appear at the outputs of said circuit 10 and they remove the asymmetry. In a particularly advantageous embodiment the resistance of the resistor 10fa, 10fb is N times smaller than the resistance of the resistors 10ga, 10gb. The current to both integrators is namely reduced since the bulk of the current flows directly to the amplifier 10c. Therefore the capacitance of the integrating capacitors 6a, 7a can be reduced, which is desired in monolithic technology.

The described circuit 10 can be provided with a filter 10h to suppress a ripple originating from the asymmetrically performed voltage terminals of the Hall sensors (FIG. 4). The filter 10h is performed by mutually connected switches 10hb, 10hc with a common terminal being connected to the first terminal of a capacitor 10ha, whose second terminal is connected to a common terminal of mutually connected switches 10hd, 10he. A common terminal of switches 10hb, 10hd is connected to the first terminal of the filter 10h, whose second terminal is connected to a common terminal of switches 10hc, 10he. The filter 10h is connected to the output of the amplifier 10c and to the first output of the described circuit 10. The switches 10hb, 10hc, 10hd, 10he are controlled by the signals $Q_S$, $\bar{Q}_S$.

Figure 5:
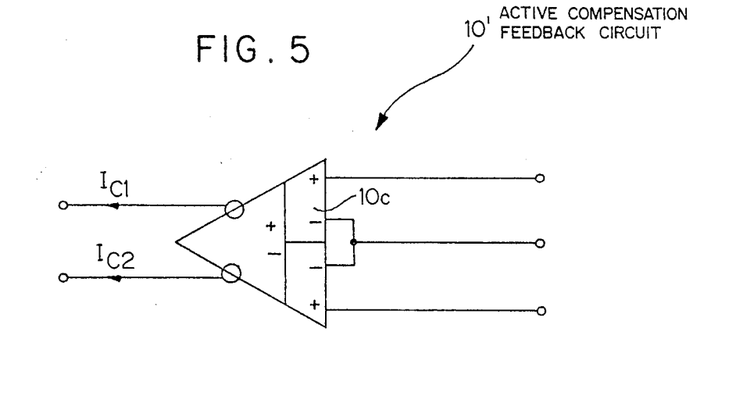
FIG. 5 is a circuit diagram of another embodiment of a compensation feedback circuit.

Another embodiment of the active compensation feedback circuit 10' is performed by a transconductance amplifier 10c' (A. P. Nedungadi, R. L. Geiger, Electronics Lett., 22, pp. 729–730 (1986); E. Saeckinger, W. Guggenbuehl, IEEE, SC-22, pp. 287–294 (1987)) and is shown in FIG. 5. The first and the second noninverting input of the amplifier 10c' are connected to the first and the second input of the circuit 10', respectively. The inverting inputs of the amplifier 10c' are connected to each other and to the third input of the circuit 10'. The current outputs of the amplifier 10c' are connected to the first and to the second output of the circuit 10', respectively. The output transistors of the first current output are advantageously provided with a channel being N times broader than the channel of the second output transistors.

The integrator 6, 7 is provided with the operational amplifier 6b, 7b, whose noninverting output is grounded, whereas the inverting output is connected to the integrator input and to the first terminal of the capacitor 6a, 7a (FIGS. 2, 3). The second terminal of the capacitor 6a, 7a is connected to the output of the amplifier 6b, 7b, which output represents the output of the integrator 6, 7.

The circuit of the differential integrator DI; DI' as regarding the connection of the switches 9a, 9b; 9a', 9b' will be disclosed later since it depends on the applied embodiment of the comparator C; C' and of the logic control circuit CL; CL' as well.

The basic embodiment of the comparator C and of the logic control circuit CL is shown in FIG. 2. The input of the comparator C is connected to the first input of a comparator 12 with hysteresis and to the first input of a comparator 13 without hysteresis, the second input of said comparators being grounded. The output of the comparator 12 is connected to the first input of the logic control circuit CL, to which input the first input of an exclusive OR gate 17 is connected. The output of the gate 17 is connected to the input D of a D-flipflop 18 and to the first input of a NAND gate 14, the second input of the gate 14 being connected to the second input of the logic control circuit CL. The latter input is connected to the output of the comparator 13. The output of the gate 14 is connected to the first input of an exclusive OR gate 15, whose inverted output signal is conducted to the clock input of a D-flipflop 16, to whose input D a signal $P_1$ is conducted. From the output Q of the flipflop 16 a switching signal $P_2$ is tapped, which is identical to the signal $P_{R1}$ and is conducted to the second input of the gate 15 and to the second input of the gate 17. The clock signal Cl is conducted to the clock input of the flipflop 18, from whose output Q a switching signal R is tapped. The signal R and the inverted clock signal $\overline{Cl}$ are conducted to the inputs of a NAND gate 25, whose output is connected to the input of a frequency divider 26. From the output of the frequency divider 26 an impulse train $f_{out}$ is tapped and it is connected to the output o of the meter according to the invention.

The switching signal $P_2$ is generated at the zero transition of the output voltage of the differential integrator DI, which is detected by the comparator 13. At each transistion of the output of the comparator 13 from logic 0 to logic 1, the signal $P_1$ is conducted to the output of the flipflop 16. The switching signal $P_2$ is synchronized in this way with the zero transitions of said output voltage. The gate 14 prevents the detecting of multiple zero transitions of said output voltage when it oscillates around zero. By the gate 15 a correct operating mode at the polarity change is provided. The comparator 12 determines the compensation impulse R, the reversal of the integration direction being taken into account by the gate 17. The flipflop 18 synchronizes the switching signal R with the clock signal Cl. The signal R is quantized by the gate 25.

In the corresponding embodiment of the differential integrator DI the first terminal of the switches 9a, 9b is connected to the second and the third input of the integrator DI, respectively, to which inputs the reference current generator RCG, RCG' is connected. The second terminal of the switches 9a, 9b is connected to a common terminal of the switches 8a, 8d and the switches 8b, 8c, respectively. The switches 9a, 9b are controlled by the signal R and the switches 8a, 8b, 8c, 8d are controlled by the signals $Q_A$, $\overline{Q_A}$; the non-overlapping signals $Q_A$, $\overline{Q_A}$ are derived from the signal $A_1$ by a RS-flipflop. A signal X for the generation of the signals $Q_S$, $\overline{Q_S}$ is tapped from the output of an exclusive OR gate (FIG. 1), to whose inputs the signals $A_1$, $P_2$ are conducted. The signals $A_1$, $P_2$ are also applied to the compensation circuit CC. The polarity of the output of the generator RCG, RCG' is controlled by the signals $P_{R1}$, $\overline{P_{R1}}$.

The measuring current $I_m$, whose direction is changed in the multiplication-adding circuit MS by the signals $Q_S$, $\overline{Q_S}$, is conducted through the switching bridge 8 to the virtual mass of the differential integrator DI. At the same time the switching bridge 8 commutates the measuring current $I_m$, the reference current $I_{R1}$ (and $I_{R2}$) and the compensation currents $I_{c1}$, $I_{c2}$ between the inputs of the integrators 6, 7 to compensate the voltage offset of the operational amplifiers and of the Hall sensors. The direction of the current $I_m$ changes synchronously with the switching of the switches in the bridge 8. Therefore the current $I_m$ is integrated without being disturbed, whereas the contribution of other currents is eliminated. The excitation of both integrators 6, 7 is symmetric when the doubled generator RCG is applied, which will be described later. Therefore the compensation currents $I_{c1}$, $I_{c2}$ originating from the feedback circuit 10 do not imply any information about the compensation impulse and the circuit 10 can be provided with a filter for suppressing the ripple.

Another embodiment of the logic control circuit CL as shown in FIG. 2 (with dashed lines taken into account) is suitable when the simple reference current generator RCG' with a constant output polarity is used. In the logic control circuit CL the signal $A_1$ is conducted to the first input of the NOR gate 19, to whose second input the output Q of the D-flipflop 18 is connected. The output $\overline{Q}$ of the Q-flipflop 16 is connected to the first input of the AND gate 21, to whose second input the output of the gate 19 is connected. The inverted signal from the output $\overline{Q}$ of the D-flipflop 16 is conducted to the first input of an AND gate 22, to whose second input the output of the gate 20 is connected. The outputs of the gates 21, 22 are connected to the inputs of a NOR gate 23, at whose output a signal $A_2$ is tapped.

The generator RCG', whose output polarity is not changed, is connected to the input terminal of the switch 9a or 9b controlled by the signal R. The switches in the bridge 8 are controlled by non-overlapping signals $Q_A$, $\overline{Q_A}$, which are derived from the signal $A_2$ by a RS-flipflop. The signal X for the generation of the signals $Q_S$, $\overline{Q}_S$ is obtained as an output signal of an exclusive OR gate (FIG. 1), to whose inputs the signals $A_2$, $P_2$ are also applied in the compensation circuit CC.

Still another embodiment of the logic control circuit LC' is shown in FIG. 3. The input of the circuit LC' is connected to the input D of a D-flipflop 14', whose output Q is connected to the first input of the exclusive OR gate 15', to the first input of an exclusive OR gate 23', and to the clock input of a D-flipflop 21'. The signal $P_1$ is conducted to the D input of the flipflop 21', at whose output Q a signal $P_3$ is tapped. The signal $P_3$ is conducted to the second input of the gate 15' and to the clock input of a D-flipflop 22', whose input D is connected to the output $\overline{Q}$ of said flipflop 22', at whose output Q a signal $P_{R3}$ is tapped. The signal $P_{R3}$ is conducted to the second input of the gate 23'. The direct output signal and the inverted output signal of said gate 23' are conducted to the inputs R, S of a RS-flipflop 24', respectively, at whose outputs signals R', $\overline{R}'$, respectively, are tapped. To the counting input of an U/D counter 16', which is controlled by the output signal of the gate 15', the clock signal Cl is conducted. The signal Cl is also conducted to the clock inputs of flipflops 14', 19'. To the input J of the flipflop 19' the output of an AND-gate 17' is connected, to whose inputs the outputs $Q_{N-1}$, $Q_N$ of the counter 16' are connected. The signal from the output $Q_{N-1}$ and the inverted signal from the output $Q_N$ are also conducted to the inputs of an AND-gate 18', whose output is connected to the input K of the flipflop 19'. The output Q of said flipflop 19' is connected to the input of a frequency divider 20', at whose output the impulse train $f_{out}$ is tapped, which is conducted to the output o of the meter according to the invention.

In the corresponding embodiment of the differential integrator DI' the first terminals of switches 9a', 9b' are connected to the second input of said integrator DI' and the second terminals of the switches 9a', 9b' are connected to the input of the integrator 6, 9, respectively. The switches 9a', 9b' are controlled by signals R', $\overline{R}'$.

The described logic control circuit CL' functions like a delta modulator when the output of the integrator DI' is connected to the first input of the comparator 13 without hysteresis. The second input of said comparator is grounded, its output, however, is connected to the input of the logic control circuit CL' (FIG. 3).

The logic control circuit CL', however, functions as an impulse-width modulator when applied in the embodiment in which the compartor 13 without hysteresis is substituted by a comparator 12 with hysteresis (FIG. 3). The impulse frequency in the signal R', $\overline{R}'$ is reduced, whereby the accuracy of the converter IFC is increased.

In the meter provided with any of the aforementioned embodiments of the logic control circuit CL' the following signals are used. The switching bridge 8 is controlled by the non-overlapping signals $Q_A$, $\overline{Q}_A$, which are derived from the signal $A_1$ by a RS-flipflop. The signal X for forming the signals $Q_S$, $\overline{Q}_S$ is obtained as an output signal of the exclusive OR-gate, to whose inputs the signals $A_1$, $P_3$ are conducted. The signals $A_1$, $P_3$ are also applied to the circuit CC. The meter is provided with the simple reference current generator RCG', the polarity of the output of said generator RCG' being reversed by the signal $P_{R3}$ or being constant.

Figure 7:
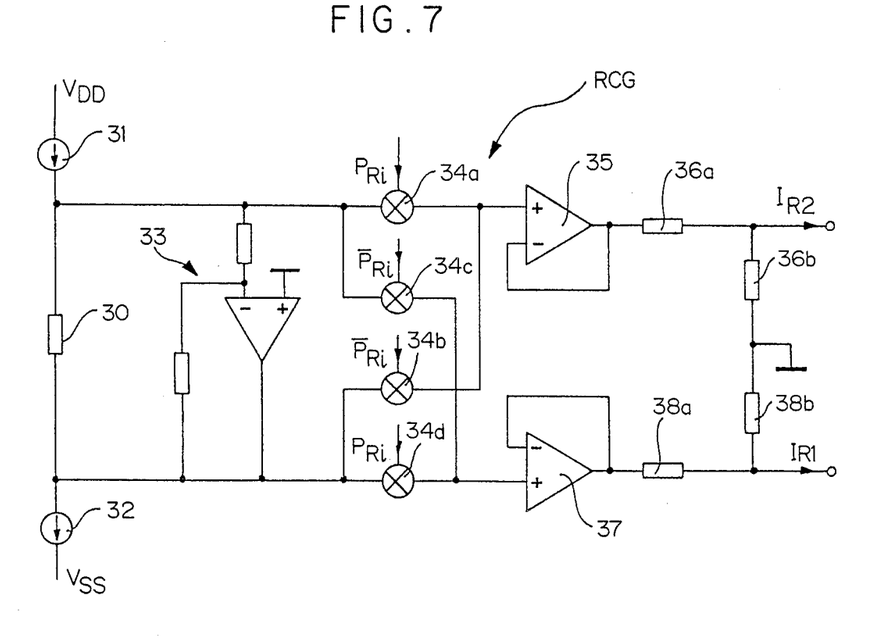
FIG. 7 is a circuit diagram of a doubled bipolar reference current generator.

The doubled bipolar reference current generator RCG is provided with a voltage generator 30 (FIG. 7), to whose output terminals a current generator 31, 32, respectively is connected. To the second terminals of the current generators 31, 32 energizing voltages $V_{DD}$, $V_{SS}$, respectively, are applied; to said second terminals there are also connected the terminals of an analog inverter 33 and the first terminals of switches 34a, 34c; 34b, 34d, respectively. The second terminals of the switches 34a, 34b; 34c, 34d are connected to the input of a follower amplifier 35, 37, respectively, whose output is connected through a resistor 36a, 38a, respectively, to the first or second output of the generator RCG, respectively. To said generator RCG outputs resistors 36b, 38b, respectively, are connected; The common terminal of said resistors 36b, 38b is grounded. The resistances of the resistors 36a, 36b and 38a, 38b are oppositely equal, which is achieved by supplying the resistors 36b, 38b with an impedance converter. In the embodiment of the active compensation feedback circuit 10 with asymmetric output potentiometers, the resistance of the resistor 36a is determined to be N times smaller than the resistance of the resistor 38a. The switches 34a, 34d; 34b, 34c are controlled by the signals $P_{R1}$, $P_{R1}$, respectively. In the meter provided with the described generator RCG, the feedback circuit with the filter 10h for suppressing the ripple of the measuring current $I_m$ is applied.

Figure 8:
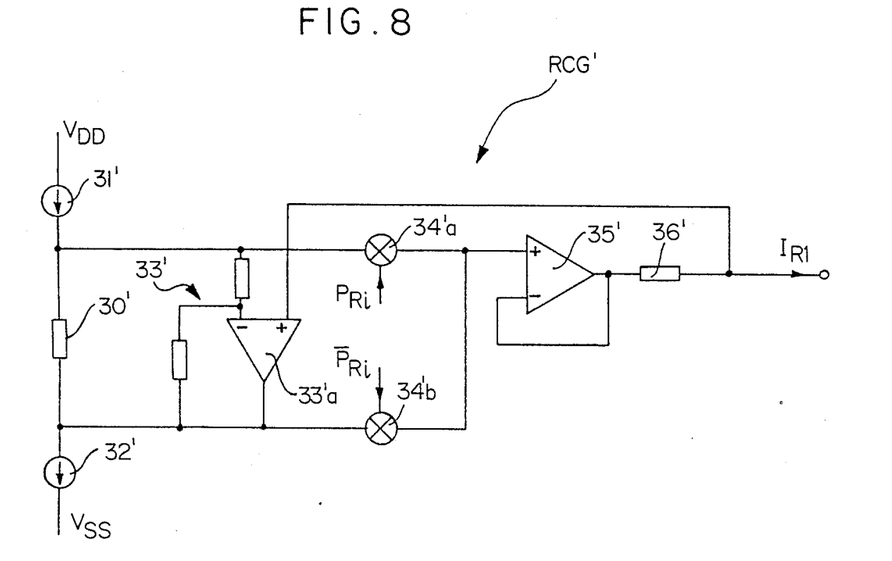
FIG. 8 is a circuit diagram of a simple bipolar reference current generator, FIGS. 9a, b is a semiconductor chip provided with a meter circuit, a ferromagnetic yoke, and a conductor, shown in a transversal and longitudinal section.

The simple bipolar reference current generator RCG' is provided with a voltage generator 30' (FIG. 8), to whose output terminals a current generator 31', 32', respectively, is connected. To the second terminals of the current generators 31', 32' energizing voltages $V_{DD}$, $V_{SS}$, respectively, are applied; to said second terminals there are also connected the terminals of an analog inverter 33' and the first terminals of switches 34a', 34b', respectively. The second terminals of said switches are connected to the input of a follower amplifier 35', whose output is connected through a resistor 36' to the output of the generator RCG'. To said generator output also the noninverting input of the amplifier 33'a is connected. By the inverter 33' a symmetry of the positive and the negative output voltage is provided. The signal for switching the output polarity of the generator RCG' has been specified at each embodiment of the current-frequency converter IFC.

To the output of the current-frequency converter IFC the compensation circuit CC is connected, whose output is connected to the input of said converter IFC (FIG. 1). The compensation circuit CC comprises a ripple compensation circuit RCC, an offset compensation circuit OCC and a circuit CICC for the compensation of charge injections within the switches, all circuits being parallel connected. In the circuit RCC; OCC; CICC the input of the circuit CC is connected to the counting input of an U/D counter $Co_R$; $Co_O$; $Co_{CI}$, respectively, which counter is controlled by the signal $A_i$; X; $P_j$, respectively; the output of said counter is connected to a latch register $L_R$; $L_O$; $L_{CI}$, respectively, to which a shift signal S is connected. The signal S is tapped from the output Q of a D-flipflop, to whose input D the logic signal state 1 is supplied, to which clock input the signal $P_j$ and to which input R the inverted clock signal Cl are conducted. The output of the aforementioned latch register is connected to the input of a digital-analog converter $DAC_R$; $DAC_O$; $DAC_{CI}$, respectively, provided with a current output, whose polarity is controlled by the signal $P_j$, is constant or is controlled by the signal $A_i$, respectively. Said signals have been specified at each embodiment of the current-frequency converter IFC. The common compensation current $I_C$ is the sum of currents $I_R$, $I_O$, $I_{CI}$ originating from the individual aforementioned parallel connected circuits within the circuit CC. The construction of each said parallel connected circuit is based on the nature of the failure being compensated.

The Hall elements 1, 2, ... (2-1)m 2n are performed symmetrically in pairs at the opposite edges of a semiconductor chip 40, on which inbetween said edges the rest of the circuit of the meter according to the invention is performed. Within the ferromagnetic yoke 44; 44', 44" the chip 40 is situated in such a manner that the Hall sensors from each pair of the Hall sensors 1, ... 2n are placed in yoke slits 44a, 44b; 44'a, 44"a with magnetic inductions directed in mutually opposite directions (FIG. 9a, b; FIG. 10). Thus the influence of interfering external magnetic fields is eliminated since the multiplication circuits $M_{Hk}$ are appropriately controlled by the signals $Q_S$, $\overline{Q}_S$.

The semiconductor chip 40 is covered by a jacket 41.

Figure 9A:
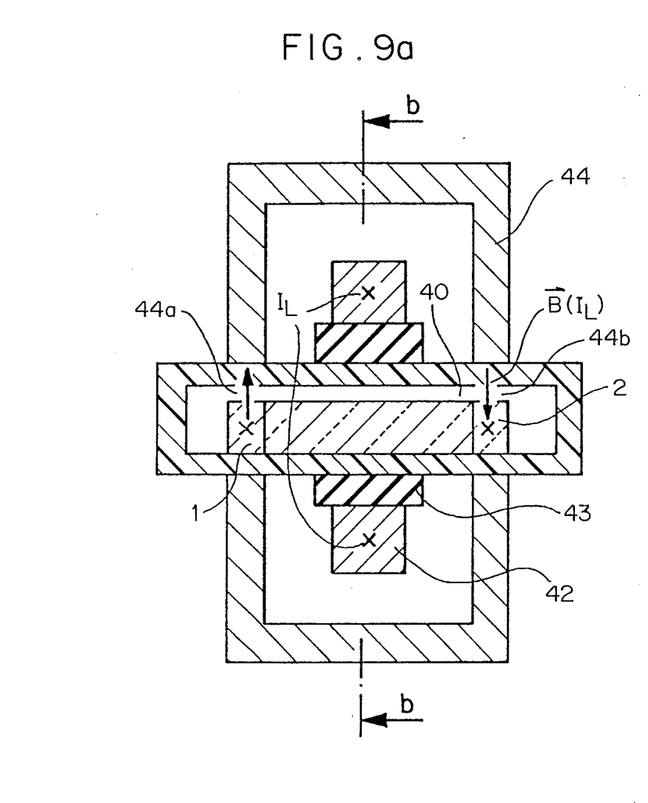
Figure 9B:
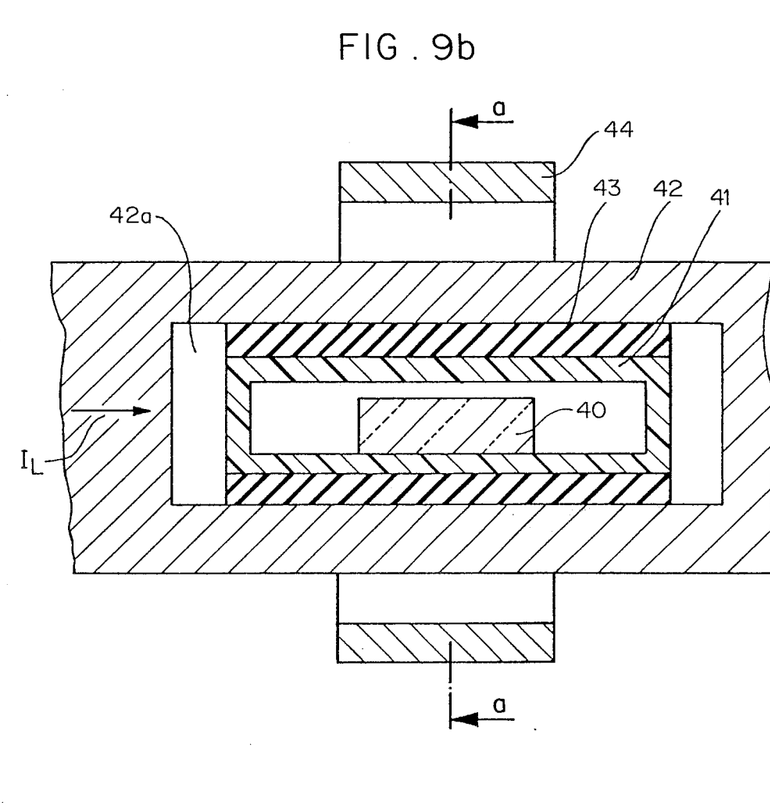
Figure 10:
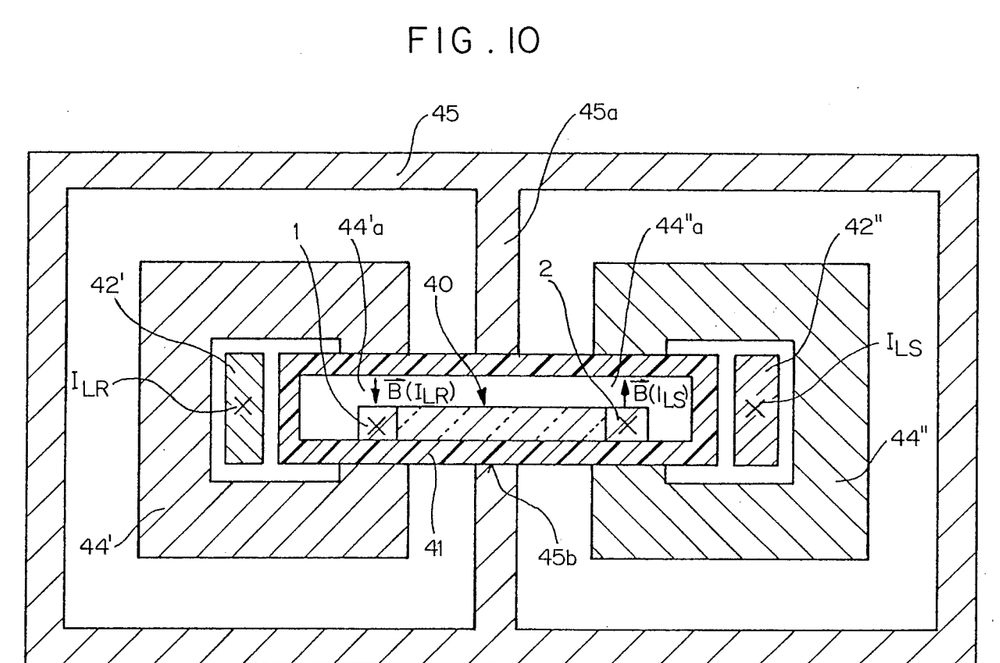
FIG. 10 is a semiconductor chip provided with a meter circuit, two ferromagnetic yokes, two conductors, and a shielding casing, shown in a transversal section.

In the axis of the simple ferromagnetic yoke 44 there is placed a conductor 42 conducting the load current $I_L$ (FIG. 9a, b). The conductor 42 is provided with a longitudinal slit 42a, into which the chip 40 is placed. The jacket 41 is covered by an insulating layer 43.

In the axes of the ferromagnetic yokes 44', 44" there are placed conductors 42', 42" conducting the load current $I_{LR}$, $I_{LS}$, respectively, of different phases (FIG. 10). The adjacent sides of the yokes 44', 44" are provided with a slit 44'a, 44"a, respectively. The chip 40 is placed so that it passes a slit 45b performed in a ferromagnetic partition 45a of a ferromagnetic casing 45 surrounding both yokes 44', 44".

The advantage of the meter according to the invention exists above all in that by applying the differential integrator the disturbing effect of parasitic capacitances is avoided; namely, instead of reversing the capacitor, both integrators are turned on alternately one after the other and therefore the integrating capacitors can be performed on a measuring chip. A further advantage exists in that the switches switching the measuring current always operate near the zero potential. Therefore the working conditions for all switches are equal and the dimensions of the switches can be reduced, whereby also the effects of charge injections are reduced. The compensation circuit reduces the effects of internally generated distortions, e.g. the ripple of the output signal, and the effects of the charge injections as well as of the voltage offset.

What is claimed is:

1. Watthour meter or wattmeter comprising Hall sensors provided with a voltage-to-current converter for the conversion of a load voltage drop into currents and provided with a multiplication-adding circuit, which is performed by cascade connected multiplication circuits controlled by switching signals and performed by Hall sensors which are placed in slits of a ferromagnetic yoke surrounding a conductor conducting a load current, whereat the currents are conducted to the input terminal of the circuits and provided with a current-frequency converter provided with a series connected differential integrator, to whose second and-/or third input a reference current generator with a controlled polarity reversal of its output terminals is connected, a comparator and a logic control circuit, whereat the output of the multiplication-adding circuit is connected to the first input of the differential integrator and with a digital signal generator for forming switching signals and the clock signal, characterized in that the first voltage terminal of the Hall sensor in one of the multiplication circuits is connected to the input of an amplifier, whose output is connected to the first terminal of a resistor, whose second terminal is connected to the output of the multiplication-adding circuit and to the noninverting input of an operational amplifier in another multiplication circuit, that the inputs of integrators in the differential integrator are connected to a common terminal of controlled switches, and the outputs of the integrators are connected to the first and to the second input, respectively, of a differential amplifier, whose output is connected to the output of the differential integrator and to the first and the second input, respectively, of an active compensation feedback circuit, whose third input is grounded, the first output is connected to the common terminal of the switches, which terminal is connected to the first input of the differential integrator, which input is connected to the output of the multiplication-adding circuit, and the second output of the feedback circuit is connected to the common terminal of the switches, and the generator is connected to controlled switches, which are connected to a switching bridge, that to the output of the current-frequency converter a compensation circuit is connected, whose output is connected to the input of the current-frequency converter, and that the Hall sensors are performed symmetrically in pairs at the opposite edges of a semiconductor chip, which is situated so that the Hall sensors from each pair are placed in yoke slits with magnetic inductions directed in mutually opposite directions.

2. Meter as recited in claim 1, characterized in that the non-overlapping signals ($Q_S$, $\overline{Q}_S$) are tapped at the outputs (Q, $\overline{Q}$), respectively of a RS-flipflop, to whose inputs (R, S) signals (X, $\overline{X}$), respectively, are conducted.

3. Meter as recited in claim 2, characterized in that the first input of the active compensation feedback circuit is connected to a first resistor and the second input of the feedback circuit is connected to a second resistor, whose second terminal is connected to the second terminal of the first resistor and to the noninverting input of an operational amplifier, whose inverting input is connected to a third resistor, whose second terminal is connected to the third input of the feedback circuit and to a fourth resistor, whose second terminal is connected to the output of the operational amplifier and to a fifth resistor, whose second terminal is connected to the first output of the feedback circuit and to a sixth resistor, whose second terminal is grounded, and to a seventh resistor, whose second terminal is connected to the second output of the feedback circuit and to an eighth resistor, whose second terminal is grounded, and that the resistances of the fifth and sixth resistors, which are opposite, are N times smaller than the resistances of the seventh and eighth resistors, which are also opposite.

4. Meter as recited in claim 3, characterized in that to the input of the integrator (6, 7) there is connected the first terminal of a capacitor (6a, 7a, resp.), which is connected to the inverting input of an operational amplifier (6b, 7b, resp.), whose noninverting input is grounded and whose output is connected to the second terminal of the capacitor (6a, 7a, resp.) and to the output of the integrator (6, 7, resp.).

5. Meter as recited in claim 3, characterized in that the first terminal of a filter (10h) for suppressing the ripple of the output signal of the circuit (MS) is connected to the output of the amplifier (10c), and the second terminal of the filter (10h) is connected to the first output of the circuit (10), and that the filter (10h) is provided with mutually connected switches (10hb, 10hc), whose common terminal is connected to the first terminal of a capacitor (10ha), whose second terminal is connected to the common terminal of mutually connected resistors (10hd, 10he), and the common terminal of the switches (10hb, 10hd) is connected to the first input of the filter (10h) and that the common terminal of the switches (10hc, 10he) is connected to the second terminal of the filter (10h), and that the switches (10hc, 10hd; 10hb, 10he) are controlled by the signals ($Q_S$; $\overline{Q}_S$, resp.).

6. Meter as recited in claim 2, characterized in that the active compensation feedback circuit (10′) is provided with a transconductance amplifier (10c′), whose first and second noninverting input are connected to the first and the second input, respectively, of the circuit (10′), and the two inverting inputs are interconnected, and the same inputs are connected to the third input of the circuit (10′), and the two current outputs of the amplifier (10c′) are connected to the first and the second output, respectively, of the circuit (10′), the transistors of the first output of the amplifier (10c′) being provided with an N times broader channel than the channel of the transistors of the second output.

7. Meter as recited in claim 6, characterized in that the compensation circuit (CC) is provided with a ripple compensation circuit (RCC), an offset compensation circuit (OCC) and a circuit (CICC) for the compensation of charge injections within switches, and that in the circuits (RCC, OCC, CICC) the input of the circuit (CC) is connected to the counting input of an up/down counter ($Co_R$; $Co_O$; $Co_{CI}$, resp.), which is controlled by the signal ($A_i$; X; $P_j$, resp.) and which is connected to a latch register ($L_R$; $L_O$; $L_{CI}$, resp.), to which register a shift signal (S) is conducted, which signal (S) is tapped at the output (Q) of a D-flipflop, to whose input (D) there is conducted the logic 1 signal and to whose clock input the signal ($P_j$) is conducted and to the input (R) the inverted clock signal (Cl) is conducted, and that said latch register is connected to a digital-analog converter ($DAC_R$; $DAC_O$; $DAC_{CI}$, resp.) provided with a current output, whose polarity is controlled by the signal ($P_j$; constant signal; $A_i$, resp.), the output of said converter being conducted to the output of the circuit (CC).

8. Meter as recited in claim 7, characterized in that the input of the comparator (C) is connected to the first input of a comparator (12) with hysteresis and to the first input of a comparator (13) without hysteresis and the second input of the comparators (12, 13) is grounded, that the output of the comparator (12) is connected to the first input of the logic control circuit (CL), which input is connected to the first input of an exclusive OR gate (17), whose output is connected to the input (D) of a D-flipflop (18) and to the first input of a NAND gate (14), whose second input is connected to the second input of the circuit (CL), which is connected to the output of the comparator (13), and that the output of the NAND gate (14) is connected to the first input of an exclusive OR gate (15), whose inverted output signal is conducted to the clock input of a D-flipflop (16), to whose input (D) a signal ($P_1$) is conducted and at whose output (Q) a switching signal ($P_2$, $P_{R1}$) is tapped, which is conducted to the second input of the gate (15) and to the second input of the gate (17), and that the signal (Cl) is conducted to the clock input of the flipflop (18), at whose output (Q) a switching signal (R) is tapped, which is conducted to the first input of a NAND gate (25), to whose second input the inverted signal (Cl) is conducted, the output of the gate (25) being connected to the input of a frequency divider (26), whose output is connected to the meter output (o).

9. Meter as recited in claim 8, characterized in that the first terminal of switches (9a, 9b) is connected to the second and to the third input, respectively, of the differential integrator (DI), the second terminal of said switches being connected to the common terminal of the switches (8a, 8d; 8b, 8c, resp.), that the switches (9a, 9b) are controlled by the signal (R) and the switches (8a, 8b; 8c, 8d) are controlled by the signal ($Q_A$; $\overline{Q}_A$, resp.), signals ($Q_A$, $Q_A$) having no overlap and being derived from the signal ($A_1$) by a RS-flipflop, and that the signal (X) is an output signal of an exclusive OR gate, to whose inputs signals ($A_1$, $P_2$) are conducted, which signals are conducted to the circuit (CC), and that the polarity reversal at the output of the generator (RCG; RCG′) is controlled by the signals ($P_{R1}$, $\overline{P}_{R1}$).

10. Meter as recited in claim 9, characterized in that to the terminals of the voltage generator (30) there are connected current generators (31, 32, resp.), the terminals of an analog inverter (33) and the first terminals of switches (34a, 34d), whose second terminals are connected to the input of a voltage follower (35, 38, resp.) and to the first terminals of switches (34c, 34b), whose second terminals are connected to the input of the follower (37, 35, resp.), that the output of the follower (35, 37) is connected through a resistor (36a, 38a, resp.) to the first and the second output, respectively, of the generator (RCG), to which outputs resistors (36b, 38b, resp.) having an oppositely equal resistance are connected, that the common terminal of the resistors (36b, 38b) is grounded, and that the switches (34a, 34d; 34b, 34c) are controlled by the signal ($P_{R1}$; $\overline{P}_{R1}$, resp.).

11. Meter as recited in claim 10, characterized in that to the control input of the amplifier (3) a function generator (4) is connected, whose output signal depends on the energizing voltage ($V_B$) of the integrated circuit, on the voltage ($V_S$) between the current terminals of the Hall sensor (k) and on the temperature-dependent sensor offset voltage ($V_T$).

12. Meter as recited in claim 11, characterized in that the semiconductor chip (40) is placed in a slit (42a) performed longitudinally in the current conductor (42), which is placed in the axes of the simple ferromagnetic yoke (44).

13. Meter as recited in claim 11, characterized in that the ferromagnetic yokes (44′, 44″) are placed in a ferromagnetic casing (45), one at each side of a partition wall (45a), the chip (40) passing a slit (45b) provided in the partition wall (45a).

14. Meter as recited in claim 9, characterized in that to the terminals of the voltage generator (30′) there are connected current generators (31′; 32′, resp.), the terminals of an analog inverter (33′) and the first terminals of the switches (34a′, 34b′), that the second terminals of said switches are connected to the input of a voltage folower (35′), whose output is connected through a resistor (36′) to the output of the generator (RCG′), to which output the noninverting input of an amplifier (33′a) is connected.

15. Meter as recited in claim 8, characterized in that the signal ($A_1$) is conducted to the first input of a NOR gate (19), to whose second input the signal (R) is conducted, and to the first input of a NAND gate (20), to whose second input the output ($\overline{Q}$) of a D-flipflop (18) is connected, that the output ($\overline{Q}$) of the flipflop (16) is connected to the first input of an AND gate (21), to whose second input the output of the gate (19) is connected, and that the inverted signal tapped at the output ($\overline{Q}$) of the flipflop (16) is conducted to the first input of an AND gate (22), to whose second input the output of the gate (20) is connected, and that the outputs of the gates (21, 22) are connected to the inputs of a NOR gate (23), at whose output a signal ($A_2$) is tapped.

16. Meter as recited in claim 15, characterized in that the first terminal of the switch (9a) is connected to the second input of the integrator(DI), the second terminal being connected to the common terminal of the switches (8a, 8d), that the switch (9a) is controlled by the signal (R) and the switches (8a, 8b; 8c, 8d) are controlled by the signals ($Q_4$; $\overline{Q}_4$, resp.) having no overlap and being derived from the signal ($A_2$) by a RS-flipflop, and that the signal (X) is the output signal of an exclusive OR gate, to whose inputs the signals ($A_2$, $P_2$) are conducted, which signals are also conducted to the circuit (CC), and that the output polarity of the generator (RCG') is constant.

17. Meter as recited in claim 7, characterized in that to the input of the logic control unit (CL') the input (D) of a D-flipflop (14') is connected, whose output (Q) is connected to the first input of an exclusive OR gate (15'), to the first input of an exclusive OR gate (23') and to the clock input of a D-flipflop (21'), to whose input (D) the signal ($P_1$) is conducted, that from the output (Q) of the flipflop (21') the signal ($P_3$) is tapped, which is conducted to the second input of the gate (15') and to the clock input of a D-flipflop (22'), whose input (D) is connected to the output ($\overline{Q}$) of said flipflop, at whose output (Q) the signal ($P_{R3}$) is tapped and is conducted to the second input of the gate (23'), whose direct output signal and inverted output signal are conducted to the inputs (R, S, resp.) of a RS-flipflop (24'), at whose output (Q, $\overline{Q}$) the signal (R', $\overline{R}'$, resp.) is tapped, that to the counting input of an up/down counter (16') controlled by the output signal of the gate (15') the signal (Cl) is conducted, which signal is also conducted to the clock input of the flipflop (14') and to the clock input of the flipflop (19'), to whose input (J) the output of an AND gate (17') is connected, the inputs of said gate (17') being connected to the outputs ($Q_{N-1}$, $Q_N$) of the counter (16'), whereas the outputs ($Q_{N-1}$, $Q_N$) of said counter are connected to the input of an AND gate (18'), whose output is connected to the input (K) of the flipflop (19'), whose output (Q) is connected to the input of a frequency divider (20'), whose output is connected to the meter output (o).

18. Meter as recited in claim 17, characterized in that the first terminals of the switches (9a'; 9b') are connected to the second input of the differential integrator (DI') and that the second terminal of the switches (9a'; 9b') is connected to the input of the integrator (6; 7, resp.), whereat said switches are controlled by the signal (R'; $\overline{R}'$, resp.)

19. Meter as recited in claim 18, characterized in that the output of the differential integrator (DI') is connected to the first input of the comparator (13) without hysteresis and that the second input of said comparator is grounded and the output of said comparator is connected to the input of the logic control circuit (CL').

20. Meter as recited in claim 19, characterized in that the switches (8a, 8b; 8c, 8d) are controlled by a signal ($Q_4$; $\overline{Q}_4$, resp.), signals ($Q_4$, $\overline{Q}_4$) having no overlap and being derived from the signal ($A_1$) by a RS-flipflop, and that the signal (X) is tapped at the output of an exclusive OR gate, to whose inputs signals ($A_1$, $P_3$) are conducted, which signals are also conducted to the circuit (CC).

21. Meter as recited in claim 18, characterized in that the output of the differential integrator (DI') is connected to the first input of the comparator (12) with hysteresis, the second input of said comparator being grounded, and that the output of said comparator is connected to the input of the logic control unit (CL').

22. Meter as recited in claim 20, characterized in that the output polarity reversal of the generator (RCG') is controlled by a signal ($P_{R3}$).

23. Meter as recited in claim 20, characterized in that the output polarity of the generator (RCG') is constant.

* * * * *